(12) United States Patent
Chan et al.

(10) Patent No.: US 7,819,013 B2
(45) Date of Patent: Oct. 26, 2010

(54) METHOD AND APPARATUS FOR MEASURING OSCILLATION AMPLITUDE OF AN ULTRASONIC DEVICE

(75) Inventors: Helen Lai Wa Chan, Hong Kong (CN); Tin Yan Lam, Hong Kong (CN); Chen Chao, Hong Kong (CN); Kin Wing Kwok, Hong Kong (CN)

(73) Assignee: The Hong Kong Polytechnic University, Hong Kong (CN)

( * ) Notice: Subject to any disclaimer, the term of this patent is extended or adjusted under 35 U.S.C. 154(b) by 773 days.

(21) Appl. No.: 11/481,205

(22) Filed: Jul. 5, 2006

(65) Prior Publication Data

US 2008/0006674 A1    Jan. 10, 2008

(51) Int. Cl.
  *B23K 1/06*   (2006.01)
  *B23K 20/10*  (2006.01)
(52) U.S. Cl. .................. 73/658; 228/1.1; 228/110.1
(58) Field of Classification Search ............. 73/658; 228/1.1, 110.1, 4.5, 180.5
See application file for complete search history.

(56) References Cited

U.S. PATENT DOCUMENTS

| | | | |
|---|---|---|---|
| 3,857,279 A * | 12/1974 | Salzer et al. ............ 73/582 |
| 4,854,494 A | 8/1989 | von Raben | |
| 5,101,599 A | 4/1992 | Takabayasi et al. | |
| 5,199,630 A | 4/1993 | Felber et al. | |
| 5,431,324 A | 7/1995 | Kajiwara et al. | |
| 5,623,307 A | 4/1997 | Kotidis et al. | |
| 5,734,108 A | 3/1998 | Walker et al. | |
| 6,181,431 B1 | 1/2001 | Siu | |
| 6,286,747 B1 * | 9/2001 | Chan et al. ............ 228/1.1 |
| 6,323,943 B1 | 11/2001 | Maruyama et al. | |
| 6,424,407 B1 | 7/2002 | Kinrot et al. | |
| 6,700,309 B2 * | 3/2004 | Dausch et al. ............ 310/330 |
| 6,827,247 B1 | 12/2004 | Fan et al. | |

* cited by examiner

*Primary Examiner*—J M Saint Surin
(74) *Attorney, Agent, or Firm*—George G. Wang; Wilkinson & Grist

(57) ABSTRACT

An apparatus and method for detecting the oscillation amplitude of a bonding tool includes a sensing unit disposed adjacent to and at a distance from the bonding tool. The sensing unit includes a pair of electrodes, a piezoelectric sensing layer located between the pair of electrodes, and a membrane associated with the piezoelectric sensing layer. The piezoelectric sensing layer becomes sensitive to ultrasonic vibrations and generates electrical voltage signals after being activated by a poling process. An optional pre-amplifier is used to amplify the signals generated from the sensing unit, and an oscilloscope is used to further process the signals.

19 Claims, 7 Drawing Sheets

METHOD AND APPARATUS FOR MEASURING OSCILLATION AMPLITUDE OF AN ULTRASONIC DEVICE

FIELD OF THE INVENTION

The present invention relates to a method and an apparatus for measuring the oscillation amplitude of an ultrasonic tool, particularly a bonding tool of ultrasonic welding device.

BACKGROUND OF THE INVENTION

A particular situation related to the present invention is an ultrasonic welding process. During an ultrasonic welding process, for example, in a semiconductor packaging process, conductive wire is bonded between electrical contact pads on the integrated circuit chip (die) and electrical contacts on the leadframe by using an ultrasonic transducer with frequency f (usually 30 kHz≦f≦200 kHz). The ultrasonic transducer has a wedge or capillary bonding tool affixed at the end of the transducer using a screw. It is this tool which applies the ultrasonic vibration from the transducer to the conductive wire to bond the wire onto the die pad or the leadframe. The oscillation amplitude of the bonding tool is one of the critical parameters necessary to achieve consistent bonding results because it indicates whether the tool has been mounted properly to the transducer as well as showing whether ultrasonic energy has been transmitted adequately from the transducer to the tool. Moreover, after the bonding tool has been in service for a period of time, wear and tear will occur and the bonding tool will need to be replaced. The oscillation amplitude of the bonding tool can thus be used as an indicator to prompt the operator to replace the tool in order to maintain quality of the bondings. Of course, in other situations where ultrasonic vibration devices are used, there may also exist the need for accurate and economical methods or apparatuses for measuring amplitude of the ultrasonic vibration or detecting the changes thereof.

A number of attempts have been made in recent years to develop methods to measure the oscillation amplitude of ultrasonic welding systems. However, these methods either cannot perform real-time measurement or involve complicated operations based on optical methods which are very costly. A few examples of these methods for measuring the oscillation amplitude of ultrasonic welding systems can be found in U.S. Pat. No. 6,827,247 and the references cited in it.

U.S. Pat. No. 6,827,247 discloses an apparatus for detecting the oscillation amplitude of an oscillating object. The apparatus includes an optical radiation source and a detector including first and second optical radiation sensing areas adjacent each other. The detector and the optical radiation source are adapted to be located opposite each other with the oscillating object located between the source and the detector so that the object blocks a portion of the sensing areas from receiving optical radiation from the source. A processor coupled to the detector receives first and second output signals representing the magnitude of optical radiation sensed by the first and second optical radiation sensing areas, respectively. The processor processes the first and second output signals to obtain an indication of the amplitude of oscillation of the object.

U.S. Pat. No. 6,424,407 discloses a method for determining the relative motion of a surface with respect to a measurement device comprising: illuminating the surface with incident illumination; detecting illumination reflected from the surface to form at least one detected signal; and determining the amount of relative motion parallel to the surface from said at least one detected signal, characterized in that said determining includes correcting for the effects of relative motion perpendicular to the surface.

U.S. Pat. No. 6,323,943 discloses a vibration measurement method and apparatus utilizing a self-mixing type laser Doppler vibrator meter. The vibration measurement method includes steps of: oscillating a laser beam of a predetermined wavelength and applying the laser beam to an object to be measured; mixing the reflected laser beam from the object and the oscillated laser beam for outputting a beat wave; calculating ratio of a beat wave amplitude for the turning point of the vibrating object, with respect to a predetermined reference amplitude; and calculating a displacement amount for the turning point of the vibrating object, according to the calculated ratio. This enables to detect the vibration of the object to be measured, with a high accuracy.

U.S. Pat. No. 6,181,431 discloses a nondestructive bond testing system. The system is implemented using a pulse laser that sends a single or multiple pulse(s) of controlled magnitude and bombards an object of interest causing a thermoelastic excitation response. This excitation in turn induces an ultrasonic propagation along or through the surface material. By detecting, capturing and interpreting these thermoelastic propagation signatures, the attachment condition of the joining materials is determined. The technique is a significant improvement over traditional mechanical pull, shear or contact type techniques. The techniques are implemented in automated high speed inspection systems suitable for real time manufacturing application. Particular applications include evaluating material joining in microelectronics manufacture (such as ball bonds) and thin coating processes.

U.S. Pat. No. 5,734,108 discloses a system that detects relative movement between an optical sensor unit and a set of finely spaced, parallel grid lines. Unlike prior optical line detection systems, each set of lines is applied to a surface of an object at an angle relative to movement between the optical sensor unit and the object. The system is particularly useful for monitoring rotating members, such as shafts, but is also useful with linearly moving members. In a preferred shaft monitoring application, a plurality of optical units are provided, with a plurality of corresponding sets of parallel lines at different angles on the shaft. Signal output phase differences between the optical units are compared to precisely determine movement of the shaft in seven directions of freedom, including rigid body displacement components along three translational and three rotational axes, and shaft twist. The differentially angled sets of lines may be spaced axially along the shaft or other object, or a plurality of angled line sets may be superimposed in a single location as a set of crosshatched lines.

U.S. Pat. No. 5,623,307 discloses a system for non-destructively measuring an object and controlling industrial processes in response to the measurement in which an impulse laser generates a plurality of sound waves over timed increments in an object. A polarizing interferometer is used to measure surface movement of the object caused by the sound waves and sensed by phase shifts in the signal beam. A photon multiplier senses the phase shift and develops an electrical signal. A signal conditioning arrangement modifies the electrical signals to generate an average signal correlated to the sound waves which in turn is correlated to a physical or metallurgical property of the object, such as temperature, which property may then be used to control the process. External, random vibrations of the workpiece are utilized to develop discernible signals which can be sensed in the interferometer by only one photon multiplier. In addition the interferometer includes an arrangement for optimizing its sensitivity so that movement attributed to various waves can be detected in opaque objects. The interferometer also includes a mechanism for sensing objects with rough surfaces which produce speckle light patterns. Finally the interferometer per se, with the addition of a second photon multiplier is capable of accurately recording beam length distance differences with only one reading.

U.S. Pat. No. 5,431,324 discloses an ultrasonic bonding apparatus. The ultrasonic bonding apparatus comprises an ultrasonic wave controller, a bonding system including a bonding head, a laser oscillator, a laser optics, a vibration monitoring system including a vibrometer, and a mechanism for feeding a result of monitoring back to a bonding condition.

U.S. Pat. No. 5,199,630 discloses a method, and apparatus for performing the method, for the ultrasonic contacting wired connection of electrical circuits to metallic leadframe strips. The apparatus essentially includes a bonding head with the energy transducer located thereon for feeding to the process point of the leadframe strip and for producing a longitudinal vibration amplitude is supplied with a first voltage, the bonding head is associated a measuring head fixed to a machine base, and the measuring head has an optical/electrical sensor which measures the instantaneous amplitude of the longitudinal vibration of the infeed of the bonding head and determining a correction factor mathematically from the measured quantities obtained, and the first ultrasonic value for the vibration amplitude of the energy transducer is calibrated with the correction factor.

U.S. Pat. No. 5,101,599 discloses an amplitude control unit for an ultrasonic machine comprising a load detector for detecting the load applied to the tip of a tool during ultrasonic machining on the work, a load/amplitude conversion circuit for converting the load output detected by the load detector into an amplitude conversion value appropriate for the load at the tip of the tool, an amplitude addition circuit for receiving the amplitude conversion value generated by the load/amplitude conversion circuit and for adding it to a predetermined amplitude value at no load. The vibration of the piezoelectric transducer is changed to correspond to the load applied to the work by sending the new amplitude value generated by the amplitude addition circuit to the high frequency oscillator.

U.S. Pat. No. 4,854,494 discloses a method of monitoring bonding parameters during a bonding process. The method is based on the object of continuous monitoring of bonding parameters in order to provide adjustment of bonding machines and thereby increase the reliability of the bonded connections. A bonding force is measured by a wire strain gauge attached to a bonding arm and an ultrasound amplitude is measured by a piezo-electric sensor secured to the bonding arm. The method can be used with all bonding machines which work with ultrasound.

Citation of documents herein is not intended as an admission that any of the documents cited herein is pertinent prior art, or an admission that the cited documents are considered material to the patentability of the claims of the present application.

SUMMARY OF THE INVENTION

According to one aspect of the present invention, there is provided an apparatus for detecting the oscillation amplitude of an ultrasonic vibration tool at an operating frequency between 20 kHz to 1000 kHz, particularly a bonding tool of ultrasonic welding device. In use, the apparatus, which is a piezoelectric sensor, is positioned adjacent to and at a distance from the oscillating part of an ultrasonic vibration device, for example, the bonding tool of an ultrasonic welding device. The piezoelectric sensor includes a pair of electrodes, a piezoelectric sensing layer located between the pair of electrodes, and a silicon membrane associated with the piezoelectric sensing layer. The piezoelectric sensing layer becomes sensitive to ultrasonic vibrations and generates electrical voltage signals when electric field is applied across the piezoelectric sensing layer to have it poled. Such poling process is performed when the piezoelectric sensor is made and the piezoelectric sensing layer remains poled afterward.

According to an embodiment of the present invention, the piezoelectric sensor comprises a piezoelectric sensing layer having a top surface and bottom surface. An electrode is deposited on each of the top and bottom surfaces of the sensing layer, and then the piezoelectric sensing layer with the pair of electrodes is deposited on a membrane structure, which can be, for example, a silicon membrane. People with ordinary skill in the art may use other materials as the membrane structure to obtain satisfactory results. In general, any materials which have a sufficient strength to hold the sensing layer and can be fabricated or machined to the desired pattern and dimension may be used.

According to a particular embodiment of the present invention, the piezoelectric sensor is mounted on a printed circuit board with the pair of electrodes being electrically connected to bonding pads on the printed circuit board. A low-noise pre-amplifier, Standford SR570 Low-noise Current Preamplifier, was used for amplifying the signals generated from the sensor, and an oscilloscope is used for observing and processing the signals. The pre-amplifier is optional and the signals can be observed without using the pre-amplifier, albeit not as strong as the one shown with the pre-amplifier. In this instance, a Hewlett-Packard 54645A oscilloscope was used (of which the bandwidth is 100 MHz and sample rate is 200 MSa/s) and, of course, any oscilloscopes with bandwidth and sample rate (for digital storage oscilloscope) large enough to observe the signals without distortion can be satisfactorily used.

According to an embodiment of the present invention, the membrane structure is fabricated from a double-size-polished silicon wafer with silicon oxide and silicon nitride coated on both the top and bottom surfaces thereof, and has a dimension of about 3 mm×3 mm. The material, dimension and shape of the membrane structure should be tuned or adjusted to give the sensor a desired resonance frequency, usually matching the operating frequency of the ultrasonic device whose amplitude is to be measured to achieve high measuring sensitivity. Such tuning is within the ordinary skill of people skilled in the art.

According to an embodiment of the present invention, the piezoelectric sensing layer is preferably made of a piezoelectric polymer, or a ceramic, composite or another material with the piezoelectric property. The thickness of the piezoelectric sensing layer is about 5 µm in this embodiment. The optimal thickness of the sensing layer, however, may be different in different embodiments and can be determined by people with ordinary skill in the art. The electrodes are preferably made of gold, although other materials with sufficient conductivity may also be satisfactorily used.

According to another aspect of the present invention, there is provided a method for detecting the oscillation amplitude of an oscillating part (for example, a bonding tool) comprising the steps of (a) positioning a piezoelectric sensor adjacent to and at a distance, for example, of about 10 mm, from the oscillating part, the sensor comprising a pair of electrodes, a poled piezoelectric sensing layer located between the pair of electrodes, and a membrane structure in contact with the piezoelectric sensing layer; said poled piezoelectric sensing layer being sensitive to vibrations of said oscillating part and capable of generating an electrical voltage signal of a strength proportional to the amplitude of said vibrations of the oscillating part; and (b) observing said electrical voltage signal on a device as an indication of said oscillating part's vibration amplitude. Preferably, if the oscillating part vibrates in a back-front direction, the piezoelectric sensor should be placed in the front or in the back of the oscillating part.

The method may further include the steps of feeding the signals generated by the piezoelectric sensor to a pre-amplifier for amplification, and then to an oscilloscope for observation and signal processing.

According to an embodiment of the present invention, one of the pair of electrodes is deposited on the silicon membrane and the other one of the pair of electrodes is deposited on the piezoelectric sensing layer by magnetron sputtering or thermal evaporation. Further, the piezoelectric sensing layer is deposited on the silicon membrane by spin-coating, magnetron sputtering, or pulsed laser deposition.

According to an embodiment of the present invention, the piezoelectric sensor is mounted on a printed circuit board with the pair of electrodes being electrically connected to bonding pads on the printed circuit board.

According to an embodiment of the present invention, the piezoelectric sensor is produced using a micromachining method combined with photolithography.

The various features of novelty which characterize the invention are pointed out with particularity in the claims annexed to and forming a part of this disclosure. For a better understanding of the invention, its operating advantages, and specific objects attained by its use, reference should be made to the drawings and the following description in which there are illustrated and described preferred embodiments of the invention.

BRIEF DESCRIPTION OF DRAWINGS

Specific embodiments of the invention will now be described by way of example with reference to the accompanying drawings wherein.

DETAILED DESCRIPTION OF PARTICULAR EMBODIMENTS

Reference will now be made in detail to a preferred embodiment of the invention, examples of which are also provided in the following description. Exemplary embodiments of the invention are described in detail, although it will be apparent to those skilled in the relevant art that some features that are not particularly important to an understanding of the invention may not be shown for the sake of clarity.

Furthermore, it should be understood that the invention is not limited to the precise embodiments described below and that various changes and modifications thereof may be effected by one skilled in the art without departing from the spirit or scope of the invention. For example, elements and/or features of different illustrative embodiments may be combined with each other and/or substituted for each other within the scope of this disclosure and appended claims.

In addition, improvements and modifications which may become apparent to persons of ordinary skill in the art after reading this disclosure, the drawings, and the appended claims are deemed within the spirit and scope of the present invention.

Figure 1:
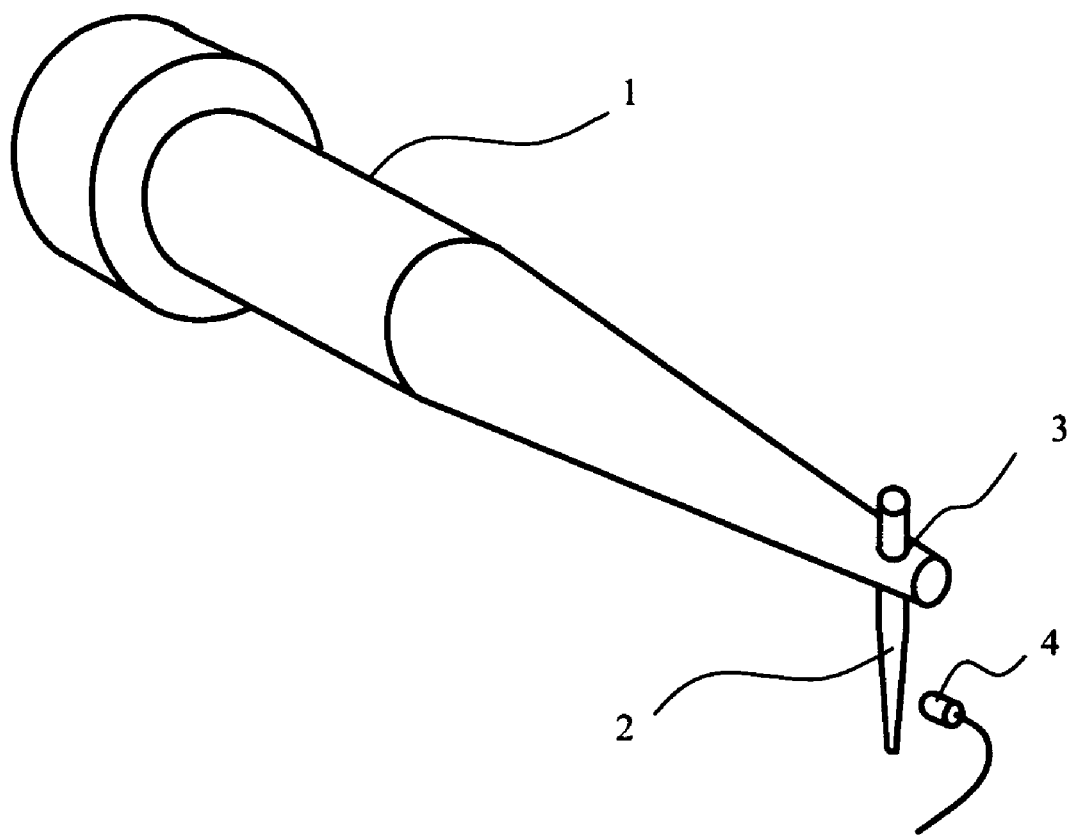
FIG. 1 is a perspective view of an ultrasonic bonding transducer and an ultrasonic sensor in accordance with an embodiment of the present invention.

FIG. 1 shows an ultrasonic transducer 1 with a bonding tool 2 (a SiC wedge or a capillary) mounted at an end of the transducer 1. In FIG. 1, the bonding tool 2 has been shown in a large scale relative to the transducer 1 for clarity. The bonding tool 2 may be located within a hole 3 at the end of the transducer 1 so that the longitudinal axis of the bonding tool 2 is approximately at right angle to the longitudinal axis of the transducer 1. The bonding tool 2 can be removably inserted into the hole 3 and held in the hole 3, for example by means of a locking screw (not shown). The position at which the bonding tool 2 should be clamped by the screw is quite crucial as it directly affects the oscillation amplitude of the bonding tool 2.

The transducer 1 and bonding tool 2 form part of a bond head of a wire bonder for bonding conductive wire to semiconductor dies and leadframes. The wire to be bonded (not shown) is introduced at the tip of the bonding tool 2 and eventually bonded to the semiconductor dies and leadframes. Also shown in FIG. 1 is a piezoelectric sensor 4 used for measuring the oscillation amplitude of the bonding tool 2 of the transducer 1.

Figure 2:
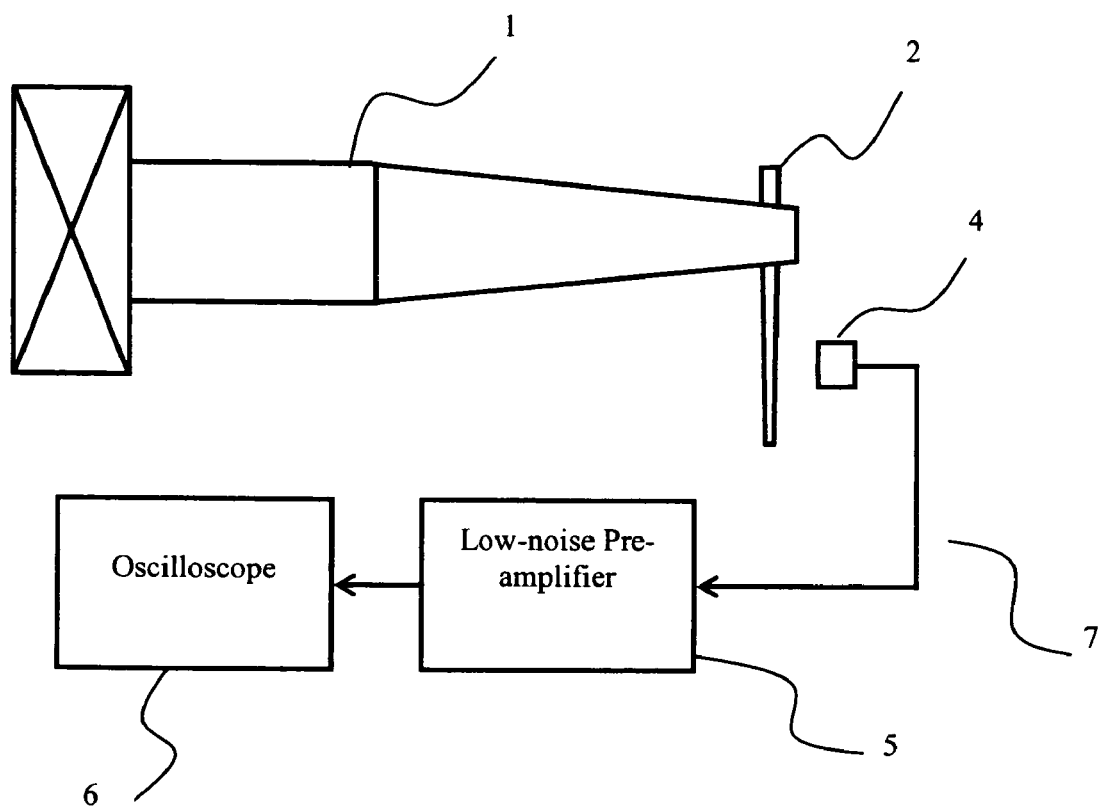
FIG. 2 is a schematic view of the transducer of FIG. 1 and the oscillation amplitude measuring apparatus in accordance with an embodiment of the present invention.

FIG. 2 shows the schematic view of the transducer 1 and an oscillation amplitude measuring apparatus 7 including the piezoelectric sensor 4. The piezoelectric sensor 4 may be located in front of or in back of the bonding tool 2 of the transducer 1, with a surface facing towards the bonding tool 2, which oscillates in a back-front direction. The signal generated by the piezoelectric sensor 4 may be fed to a pre-amplifier 5 for amplification and then to an oscilloscope 6 for observation and signal processing. The pre-amplifier 5 should be of low noise and with electrical impedance matched to the sensor response as closely as possible.

Figure 3A:
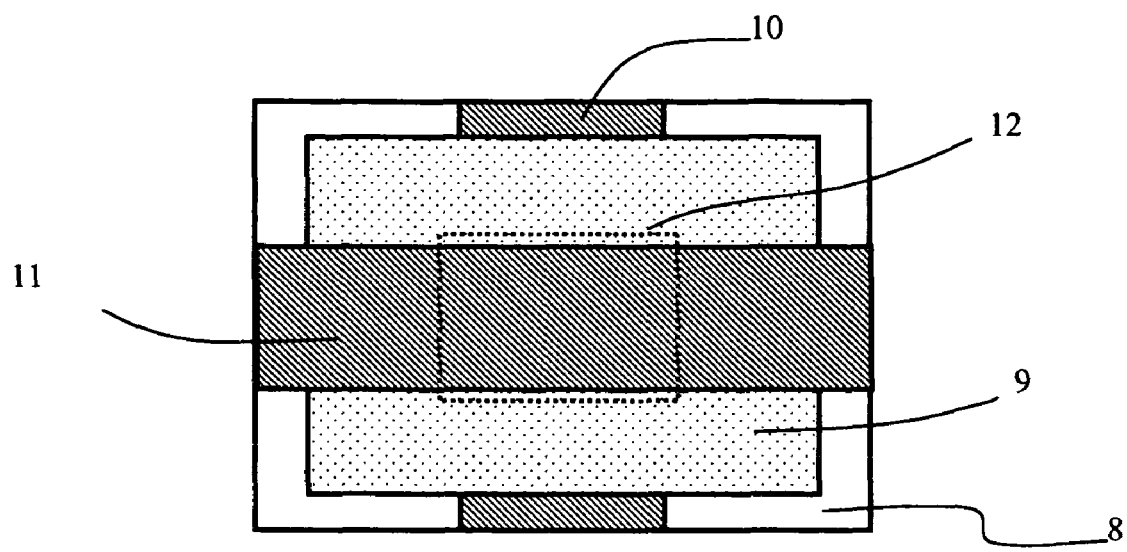
FIG. 3a is a schematic diagram showing the top view of the micromachined sensing unit of the ultrasonic sensor used in the measuring apparatus shown in FIG. 2.
Figure 3B:
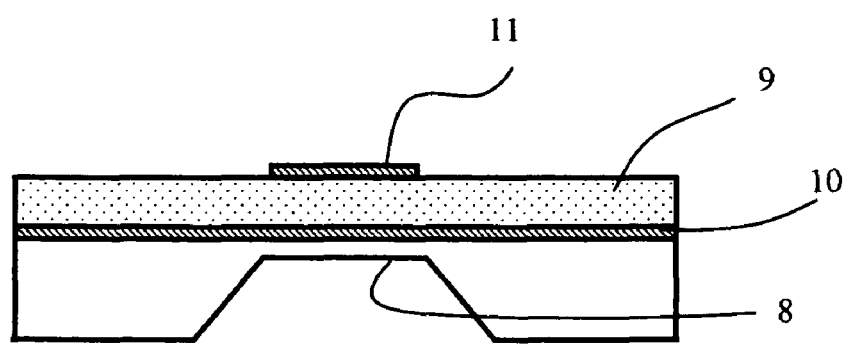
FIG. 3b is a schematic diagram showing the cross-sectional view of the micromachined sensing unit of the ultrasonic sensor used in the measuring apparatus shown in FIG. 2.

FIGS. 3a and 3b show the schematic top view and cross-sectional view respectively of a micromachined sensing unit of the piezoelectric sensor 4 used in the measuring apparatus 7 shown in FIG. 2. In FIGS. 3a and 3b, the sensing unit is enlarged and not in scale, in particular the cross-sectional view, for clarity.

The sensing unit may consist of a silicon membrane 8 and a piezoelectric sensing layer 9. The piezoelectric sensing layer 9 of the sensor can be made of a piezoelectric polymer. It can also be made of a ceramic and composite material, or any other suitable material.

In-between the membrane 8 and the piezoelectric sensing layer 9, there is a metal layer 10 which serves as a bottom electrode for the piezoelectric sensing layer 9. There is another metal layer II deposited on the top surface of the piezoelectric sensing layer 9, serving as a top electrode of the piezoelectric sensing layer 9. The metal layers 10, 11 can be made of gold. The metal layers 10, 11 can also be made of other metals with good conductivity. The silicon membrane 8 may be fabricated from a double-size-polished silicon wafer with silicon oxide and silicon nitride coated on both the top and bottom surfaces.

The membrane structure may be produced using a micromachining method combining with a photolithography technique. The dimension of the membrane 8 may be about 3 mm×3 mm. The dimension and thickness of the membrane 8 can be adjusted to give a resonance frequency substantially the same as the operating frequency of the ultrasonic bonding transducer 1. The silicon membrane 8 of the ultrasonic sensor 4 is the component to be tuned to produce an ultrasonic sensor having a resonance frequency similar to the operating frequency of the ultrasonic bonding transducer. Such an ultrasonic sensor gives the highest sensitivity at the operating frequency of the ultrasonic bonding transducer 1.

The metal layer or bottom electrode 10 may be deposited on the silicon membrane 8 by magnetron sputtering. Other deposition techniques, such as thermal evaporation, can also be used to deposit the bottom electrode 10 on the silicon membrane 8. The piezoelectric sensing layer 9 may be deposited on the silicon membrane 8 by a spin-coating method. Other deposition techniques, such as magnetron sputtering and pulsed laser deposition, can also be used to deposit the piezoelectric sensing layer 9 on the silicon membrane 8. The thickness of the piezoelectric sensing layer 9 can be about 5 µm.

The metal layer or top electrode 11 may be deposited on the piezoelectric sensing layer 9 by magnetron sputtering. Other deposition techniques, such as thermal evaporation, can also be used to deposit the top electrode 11 on the piezoelectric sensing layer 9.

The piezoelectric sensing layer 9 lies between the top and bottom electrodes 11, 10 and defines an active sensing area 12, which may be about 3 mm×3 mm, of the ultrasonic sensor 4. An electric field of about 100 MV/m may be applied across the top and bottom electrodes 11, 10 to pole the active sensing area 12 of the piezoelectric polymer layer 9. The poling process can activate the piezoelectricity of the piezoelectric sensing layer 9. After the poling process, the active sensing area 12 becomes sensitive to ultrasonic vibrations and generates electrical voltage signals across the top and bottom electrodes 11, 10. After the poling process was performed during fabrication of the sensor, the active sensing area of the piezoelectric sensing layer remains sensitive to ultrasonic vibrations afterward.

Figure 4:
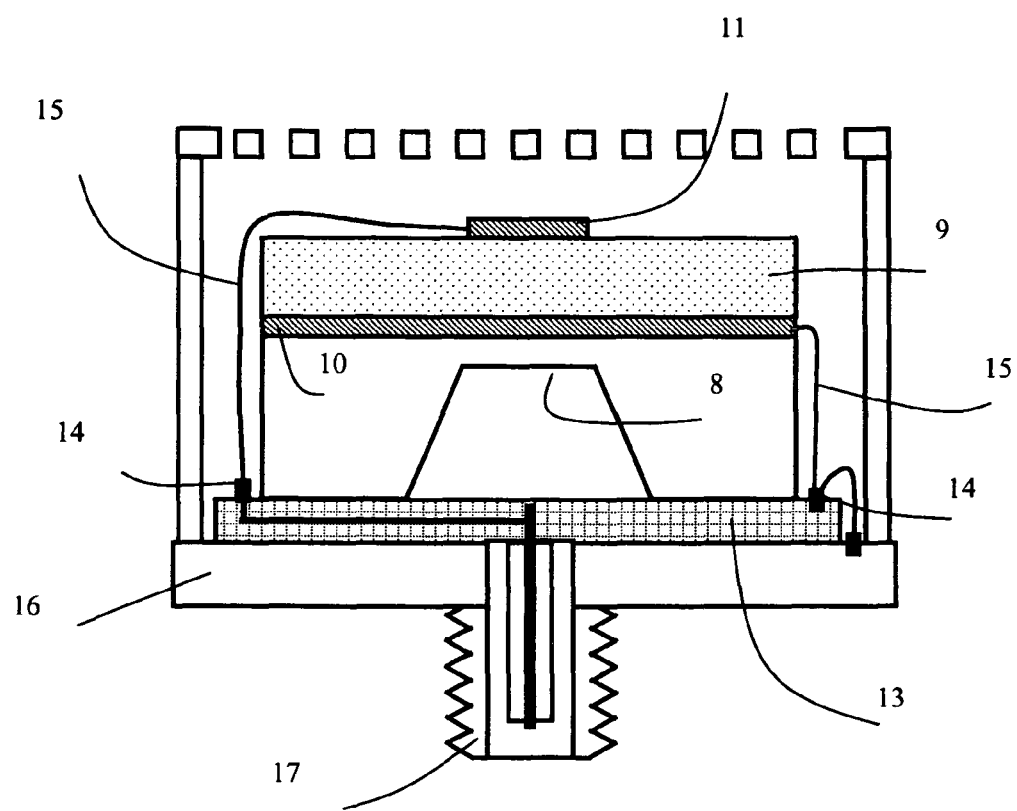
FIG. 4 is a cross-sectional view of the ultrasonic sensor used in the measuring apparatus shown in FIG. 2.

FIG. 4 shows the cross-sectional view of the ultrasonic sensor 4 used in the measuring apparatus 7 shown in FIG. 2. As shown in FIG. 4, the micromachined sensing unit shown in FIGS. 3a and 3b may be mounted tightly on a small piece of PCB 13 with the top and bottom electrodes 11, 10 being electrically connected to bonding pads 14 on the PCB using copper wires 15. The whole assembly (micromachined sensing unit together with the PCB) may then be packaged in a metal housing 16 to protect the sensing unit and to minimize electromagnetic interference from the machine. The metal housing 16 may have a connector 17 at one end for connecting with coaxial cables to transfer signal for further processing.

Figure 5:
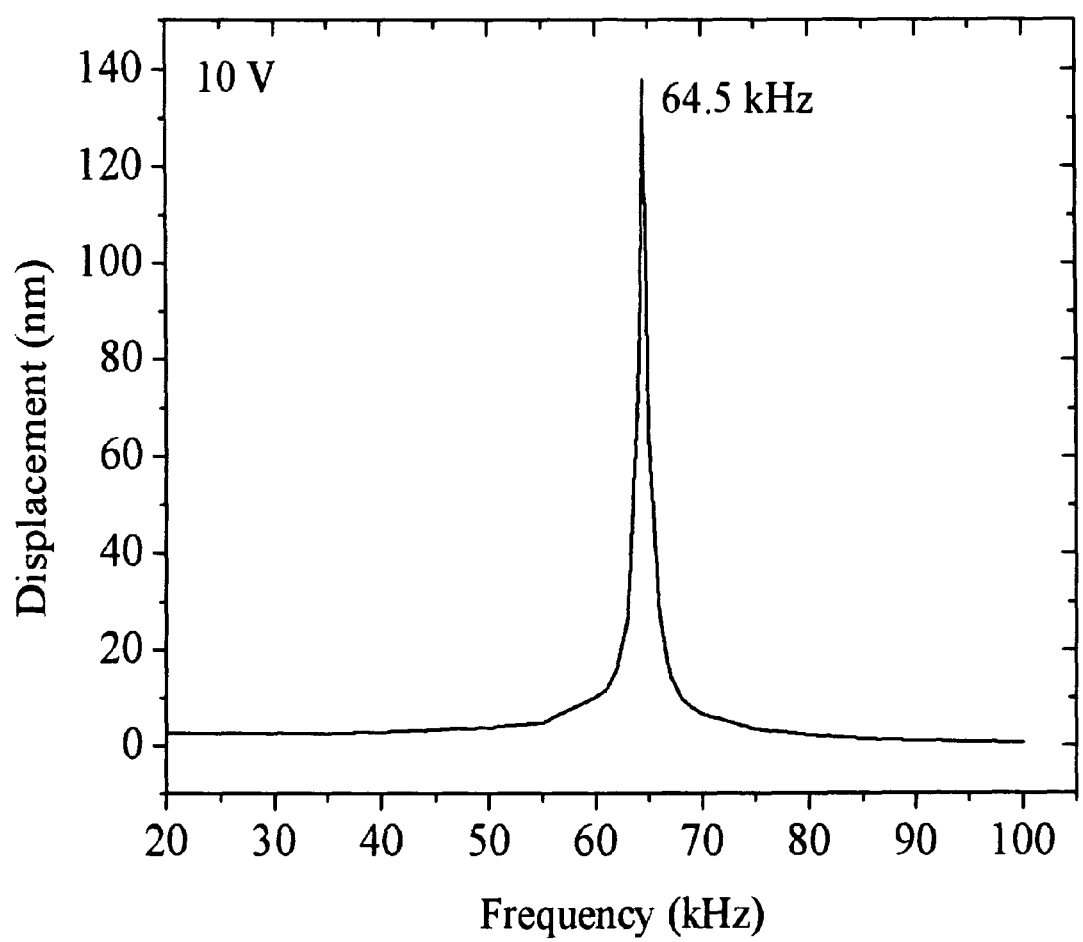
FIG. 5 shows the displacement at the center of the ultrasonic sensor as a function of frequency measured using a laser vibrometer.

FIG. 5 shows the displacement at the center of the ultrasonic sensor 4 as a function of frequency measured using a laser vibrometer (Polytec OFV 3000). An AC electric field of amplitude of 10 V and frequency ranging from 20 kHz to 100 kHz is applied to the piezoelectric sensing layer 9 to drive the membrane 8 into vibration. A piezoelectric material, such as the piezoelectric polymer used in the present invention, is a material which can generate electric charges when it experiences a mechanical stress (direct piezoelectric effect) or produce a strain upon the application of an electric field (converse piezoelectric effect). The laser beam from the laser vibrometer may be focused at the centre of the sensing unit in order to measure the maximum deflection of the membrane.

The observed displacement is shown in FIG. 5 as a function of frequency. It can be seen that the observed displacement reaches a maximum value of about 140 nm at 64.5 kHz. This displacement peak corresponds to the fundamental resonance mode of the membrane and has been confirmed by the measurement of the displacement across the membrane 8.

The observed resonance frequency (64.5 kHz) of the membrane 8 is very close to the operating frequency (64 kHz) of the ultrasonic bonding transducer 1, suggesting that the ultrasonic sensor 4 has the highest sensitivity in detecting the ultrasonic vibration signal of the bonding tool 2. It is noted that the dimensions, thickness and resonance frequency of the sensing unit can be adjusted to match the bonding transducer and can be used in high-frequency (e.g. 120 kHz or above) ultrasonic wire bonding.

The ultrasonic sensor 4 can then be used together with the pre-amplifier 5 and the oscilloscope 6 to form the oscillation amplitude measuring apparatus 7 as shown in FIG. 2 so as to measure the ultrasonic vibration of the bonding tool 2 of the ultrasonic transducer 1. The ultrasonic sensor 4 may be located at a position which may be about 10 mm in front of the bonding tool 2 and about 5 mm above the end of the bonding tool 2. The bonding transducer 1 may be driven at an operating frequency under a constant-voltage.

Figure 6:
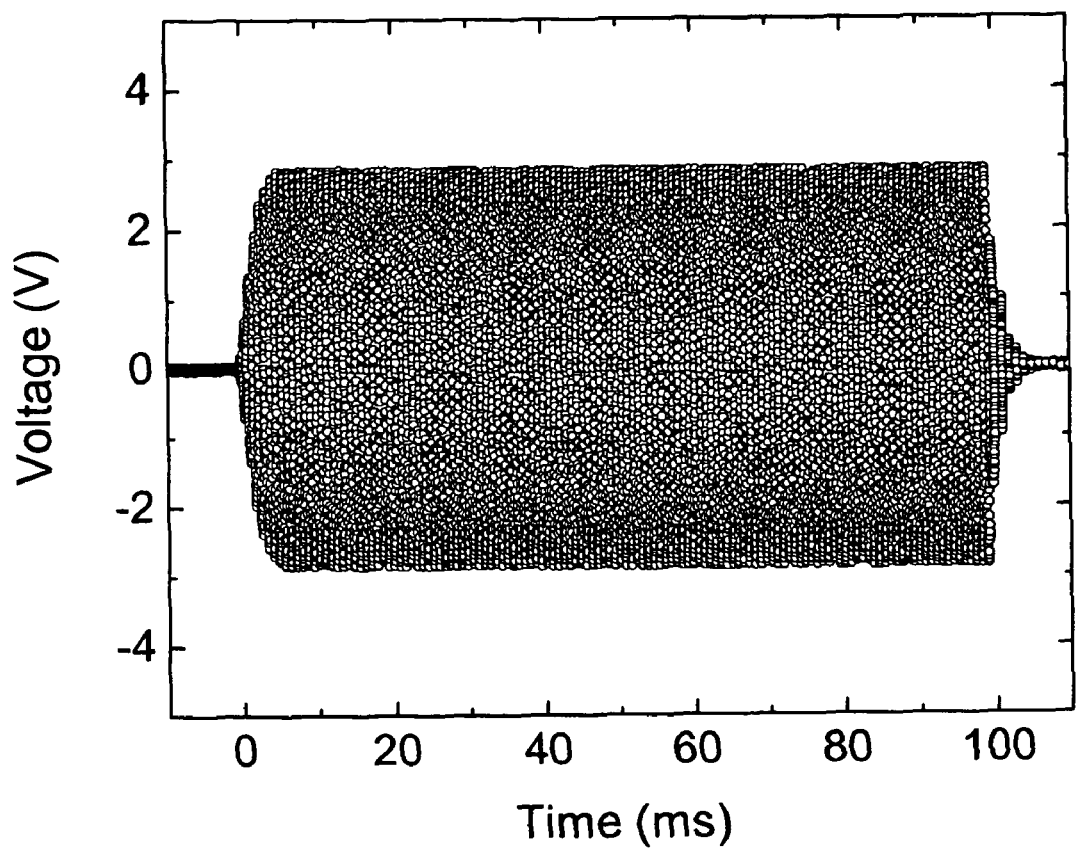
FIG. 6 shows graph of output signal of the ultrasonic sensor used in the measuring apparatus shown in FIG. 2 when the bonding tool is oscillating freely (i.e. before making contact with the wire to be bonded)

FIG. 6 shows the output signal of the measuring apparatus 7 when the bonding transducer 1 and the bonding tool 2 are driven to oscillate freely (i.e. without performing any wire-bonding) for 100 ms. It is clearly seen that the ultrasonic sensor 4 can effectively detect the ultrasonic vibration of the bonding tool 2. The constant-amplitude vibration of the bonding tool 2 (driven by the constant voltage) can be effectively detected by the ultrasonic sensor 4, giving a constant voltage signal of about 3 V.

The observed signal can be very clear and can be used for further signal processing. The response time of the ultrasonic sensor 4 can be fast so that it responses almost instantaneously to the vibration of the bonding tool 2 and gives no signal right after the driving voltage is switched off.

The observed voltage signal can be calibrated to give the oscillation amplitude of the detected region of the bonding tool 2 (i.e. about 5 mm from the bottom of the bonding tool) by using the calibration factor G, which is given as $$G = U_V / U_S$$

where $U_S$ is the observed voltage signal by the ultrasonic sensor 4 and $U_V$ is the oscillation amplitude of the bonding tool 2 measured using, for example, a laser vibrometer at the same position for detecting the ultrasonic voltage signal.

As the ultrasonic sensor 4 can detect the ultrasonic vibration of the bonding tool 2 in a non-contact manner, it can be used to monitor the ultrasonic vibration of the bonding tool 2 during a wire-bonding process.

Figure 7:
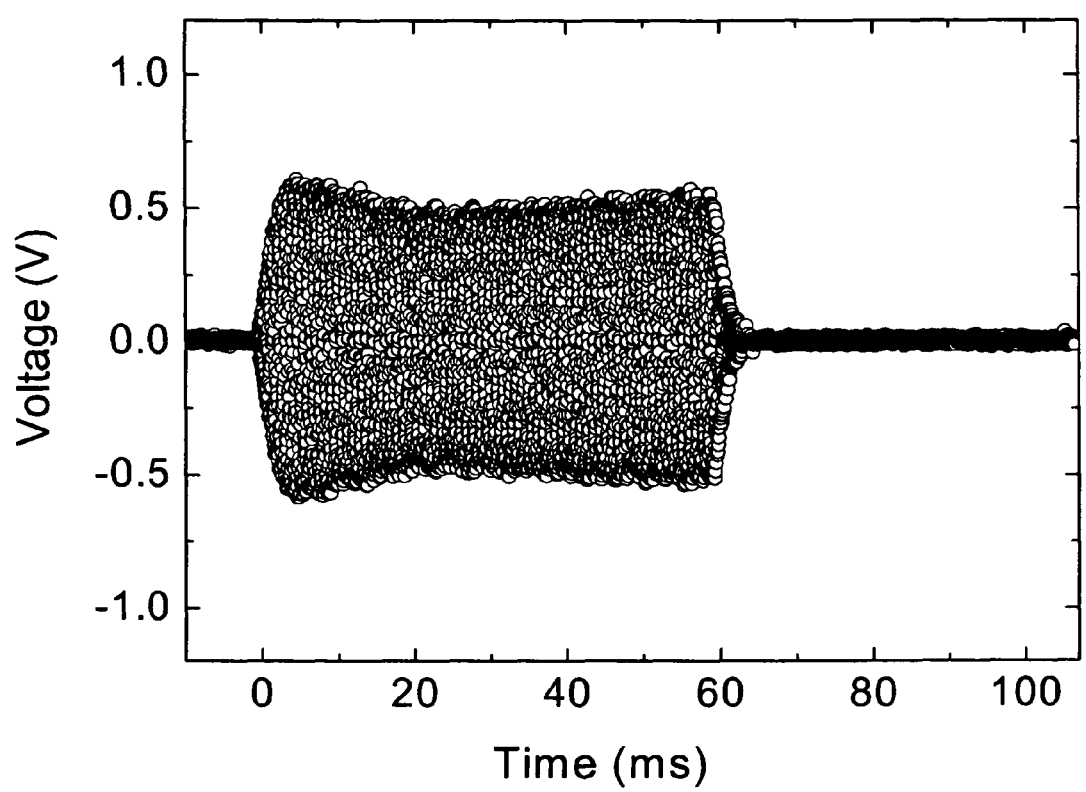
FIG. 7 shows graph of output signal of the ultrasonic sensor used in the measuring apparatus shown in FIG. 2 during a wire bonding process.

FIG. 7 shows the output signal of the measuring apparatus 7 when the ultrasonic transducer 1 is driven to perform a regular wire-bonding process. The ultrasonic sensor 4 may be located at a position 10 mm in front of the bonding tool 2. It is clearly seen that the ultrasonic sensor 4 can effectively detect the ultrasonic vibration of the bonding tool 2, without influencing its performance, during the wire bonding process. From the output voltage signal, bonding parameters including the amplitude and duration of each ultrasonic burst can be determined and used to monitor the quality of the bonding.

The present invention provides a method, and an apparatus for performing the method, by means of which the ultrasonic oscillation of a bonding tool is correspondingly measured. As compared to the existing technology, the method of the present invention is more simple and cost effective.

While there have been described and pointed out fundamental novel features of the invention as applied to a preferred embodiment thereof, it will be understood that various omissions and substitutions and changes, in the form and details of the embodiments illustrated, may be made by those skilled in the art without departing from the spirit of the invention. The invention is not limited by the embodiments described above which are presented as examples only but can be modified in various ways within the scope of protection defined by the appended patent claims.

What is claimed is:

1. A piezoelectric sensor, being designed for detecting the oscillation amplitude of an oscillating part of an ultrasonic device and comprising:
   (a) a first electrode and a second electrode,
   (b) a piezoelectric sensing layer located between said first and second electrodes, and
   (c) a membrane having a surface, said surface being in contact with said piezoelectric sensing layer;
wherein said piezoelectric sensor is in separation from said ultrasonic device, said membrane is shaped and dimensioned for giving a resonance frequency between 20 kHz to 1000 kHz, and said piezoelectric sensing layer is sensitive to ultrasonic vibrations and generating electrical voltage in proportion with the amplitude of said ultrasonic vibrations of said oscillating part.

2. The piezoelectric sensor of claim 1, wherein said oscillating part is a bonding tool of an ultrasonic welding device and said membrane have a resonance frequency similar to an operating frequency of said ultrasonic welding device, which is between 30 kHz and 200 kHz.

3. The piezoelectric sensor of claim 2, wherein said piezoelectric sensing layer is made of a polymer, ceramic, or composite material.

4. The piezoelectric sensor of claim 2, wherein said membrane is made of silicon and said first electrode and second electrode are made of a metal material.

5. The piezoelectric sensor of claim 4, wherein said membrane has a top surface and a bottom surface coated with silicon oxide and silicon nitride.

6. The piezoelectric sensor of claim 5, wherein said top surface of said membrane is about 3 mm×3 mm in dimension.

7. The piezoelectric sensor of claim 2, wherein said second electrode is deposited on said membrane by magnetron sputtering or thermal evaporation.

8. The piezoelectric sensor of claim 2, wherein said piezoelectric sensing layer is about 5 μm in thickness.

9. A system for measuring the oscillation amplitude of an oscillating part of an ultrasonic device, comprising:
   (a) an oscillating part of an ultrasonic device, with an oscillation direction from front to back;
   (b) a piezoelectric sensor in separation from said ultrasonic device, placed in front or in back of said oscillating part and capable of generating an electric voltage signal in responding to an oscillation of said oscillating part;
   (c) an oscilloscope in connection with said piezoelectric sensor for observing said voltage signal.

10. The system of claim 9, further comprising a pre-amplifier between said piezoelectric sensor and said oscilloscope for amplifying said signal before being sent to said oscilloscope.

11. The system of claim 9, wherein said oscillating part is a bonding tool of an ultrasonic welding device and the distance between said bonding tool and said piezoelectric sensor is about 10 mm.

12. A method for detecting the oscillation amplitude of an oscillating part of an ultrasonic device comprising the steps of:
   (a) positioning a piezoelectric sensor in separation from said ultrasonic device and at a distance from said oscillating part, said piezoelectric sensor comprising a pair of electrodes, a poled piezoelectric sensing layer located between said pair of electrodes, and a membrane in contact with said piezoelectric sensing layer; said piezoelectric sensing layer being sensitive to vibrations of said oscillating part and capable of generating an electrical voltage signal of a strength proportional to the amplitude of said vibrations of said oscillating part; and
   (b) observing said electrical voltage signal on a device as an indication of said oscillating part's vibration amplitude.

13. The method as claimed in claim 12, wherein said oscillating part is a bonding tool of an ultrasonic welding device.

14. The method as claimed in claim 13, wherein one of said pair of electrodes is deposited on said membrane and the other one of said pair of electrodes is deposited on said piezoelectric sensing layer by magnetron sputtering or thermal evaporation.

15. The method as claimed in claim 13 wherein said piezoelectric sensing layer is deposited on said membrane by spin-coating, magnetron sputtering, or pulsed laser deposition.

16. The method as claimed in claim 13 wherein said sensor is mounted on a printed circuit board with said pair of electrodes being electrically connected to bonding pads on said printed circuit board.

17. The method as claimed in claim 13 further comprising the steps of feeding the signal generated by said sensor to a pre-amplifier for amplification, and then to an oscilloscope for observation and signal processing.

18. The method as claimed in claim 13 wherein said sensor is produced using a micromachining method combined with photolithography.

19. The method as claimed in claim 13 wherein said bonding tool is oscillating in a back-front direction and said sensor is placed about 10 μm in the front or back of said bonding tool.

* * * * *